United States Patent
Liu et al.

(10) Patent No.: US 6,878,581 B1
(45) Date of Patent: Apr. 12, 2005

(54) ELECTROSTATIC DISCHARGE PROTECTION STRUCTURE AND A METHOD FOR FORMING THE SAME

(75) Inventors: Yuan-Chang Liu, Hsinchu (TW); Mu-Chun Wang, Hsinchu Hsien (TW); Tien-Hao Tang, Taipei Hsien (TW)

(73) Assignee: United Microelectronics Corp., Hsinchu (TW)

( * ) Notice: Subject to any disclaimer, the term of this patent is extended or adjusted under 35 U.S.C. 154(b) by 1040 days.

(21) Appl. No.: 09/791,099

(22) Filed: Feb. 22, 2001

(51) Int. Cl.[7] .......................................... H01L 21/8238
(52) U.S. Cl. .................................... 438/200; 438/275
(58) Field of Search ................................ 438/199, 200, 438/275, 301, 510, 527, 202, 278, 281, 291, 305, 592

(56) References Cited

U.S. PATENT DOCUMENTS 5,597,758 A * 1/1997 Heim et al. ................. 438/527
5,910,673 A * 6/1999 Hsu et al. .................... 257/355

* cited by examiner

*Primary Examiner*—David Nelms
*Assistant Examiner*—Phuc T. Dang
(74) *Attorney, Agent, or Firm*—Charles C. H. Wu; Charles C. H. Wu & Associates

(57) ABSTRACT

A device structure and a method of fabricating an electrostatic discharge (ESD) protection circuit on a semiconductor device. A substrate is provided. A layer of silicon oxide is formed on the substrate. A photoresist mask is formed on the layer of silicon oxide. A species of n-type ions is implanted into the surface to form source/drain regions in the ESD protection area. After removing the photoresist, a metal layer is blanket deposited over the surface. A thermal process is performed to form salicide layers on the source/drain regions. A patterned photoresist is respectively formed to cover a portion of the salicide layer. An etching process is performed to strip away the exposed portion of the salicide layer.

18 Claims, 5 Drawing Sheets

ELECTROSTATIC DISCHARGE PROTECTION STRUCTURE AND A METHOD FOR FORMING THE SAME

BACKGROUND OF THE INVENTION

1. Field of the Invention

The present invention relates to a semiconductor device and a manufacturing method thereof. More particularly, the present invention relates to an electrostatic discharge (ESD) protection circuit on a semiconductor device and a method for forming the same.

2. Description of the Related Art

Damage from electrostatic discharge (ESD) is a significant failure mechanism in modern integrated circuits, particularly as integrated circuit (IC) physical dimensions continue to shrink to the sub-micron range. Electrically, an ESD event occurs upon contact of one or more of the terminals of an IC terminal with a body that is statically charged to a high voltage (up to on the order of thousands of volts). This level of static charge is readily generated by the triboelectric effect and other mechanisms acting upon humans or manufacturing equipment. Upon contact, the IC discharges the charged body through its active devices and DC current paths. If the amount of charge is excessive, however, the discharge current density can damage the IC so that it is no longer functional, or so that it is more prone to later life failure. ESD damage thus is a cause of yield loss in manufacturing, and also poorer reliability in use.

It is common practice in the art to implement, into each IC, ESD protection devices connected to the external terminals of the circuit. ESD protection devices are designed to provide a current path of sufficient capacity to safely discharge the charge applied thereto by a charged body in an ESD event, but to not inhibit the functionality of the IC in normal operation. The addition of ESD protection devices necessarily add parasitic effects that degrade circuit performance; in some cases such as series resistors, the ESD protection devices directly add delay to electrical performance. Accordingly, a desirable goal for ESD protection devices is to provide a high capacity current path, which is readily triggered during an ESD event but which can never trigger during normal operation, and which presents minimal effect on circuit performance.

FIG. 1 is a schematic, cross-sectional view of a conventional ESD protective circuit.

A substrate 100 is provided. A plurality of field oxide layers 102 are formed in the substrate 100 to serve as isolation structures, which define out an active region. These field oxide layers 102 can be formed either through a LOCOS (local oxidation of silicon) process or by first performing an STI (shallow trench isolation) process to form trenches in the substrate 100 and then performing a CVD (chemical-vapor deposition) process to deposit oxide into the trenches. A gate oxide layer 112, a polysilicon layer 114, a spacer 116, and a source/drain region 118 with a lightly doped drain (LDD) region (the source/drain region 118 comprises an $N^+$ doped region and an $N^-$ doped region) are sequentially formed on the substrate 100. Subsequently, self-aligned silicide (salicide) layers 120 are respectively formed on the polysilicon layer 114 and on the source/drain region 118 by a salicide process. Next, a patterned photoresist is respectively formed to cover the active region. A portion of the salicide layer exposed by the patterned photoresist is stripped away by dry etching until a portion of the source/drain region is exposed. The photoresist is then removed. Subsequently, a thick inter-layer dielectric (ILD) layer 122 is formed over the entire top surface of the wafer. This dielectric layer 122 is then selectively removed to form a contact window to expose the source/drain region.

In the conventional process for fabricating an ESD protection device, the source/drain regions are formed as lightly-doped drain (LDD) structures in order to prevent a short channel effect in the internal circuitry. However, these LDD structures result in a higher Zener breakdown voltage which in turn causes the bipolar turn-on speed to slow down and which results in a decrease of the ESD responsiveness of the ESD protection device.

Further, in the conventional process for fabricating ESD protection devices, a thinner gate oxide layer is necessary as the integration of semiconductor devices is increased. This may result in gate thinning and lead to a higher defect density and increased weak point probability.

It is therefore an objective of the present invention to provide a method for forming an electrostatic discharge protection device having increased electrostatic discharge responsiveness.

SUMMARY OF THE INVENTION

The present invention provides an improved device structure and an improved method of fabricating an electrostatic discharge (ESD) protection circuit on a semiconductor device. The ESD device structure comprises a substrate, a layer of silicon oxide on the substrate, wherein a species of n-type ions is implanted into the surface of the substrate to form source/drain regions, and a metal layer formed on the substrate, wherein a thermal process is performed to form salicide layers on the source/drain regions.

The invention further provides a method of fabricating an ESD device. A layer of silicon oxide is formed on a substrate. A photoresist mask is formed on the layer of silicon oxide. A species of n-type ions is implanted into the surface of the substrate to form source/drain regions in the ESD protection area. After removing the photoresist, a metal layer is blanket deposited over the surface of the substrate. A thermal process is performed to form salicide layers on the source/drain regions. An etching process is performed to strip away the unreacted portions of the metal layer.

As mentioned above, this novel ESD protection device has source/drain regions formed as in a single-diffused fashion (N+ implantation) rather than the conventional method of forming LDD structures. Without the formation of LDD structures, a higher Zener breakdown voltage, which in turn causes slow down of the bipolar turn-on speed, which ultimately results in a decrease of the ESD responsiveness of the protection device, is prevented. Moreover, since LDD structures are not required, there is a reduction in the number of required masking steps during ion implantation, which results in a more cost efficient process.

It is to be understood that both the foregoing general description and the following detailed description are exemplary and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and together with the description serve to explain the principles of the invention. In the drawings, FIG. 1. is a schematic cross sectional view showing a conventional ESD protection circuit.

DESCRIPTION OF THE PREFERRED EMBODIMENTS

Figure 1:
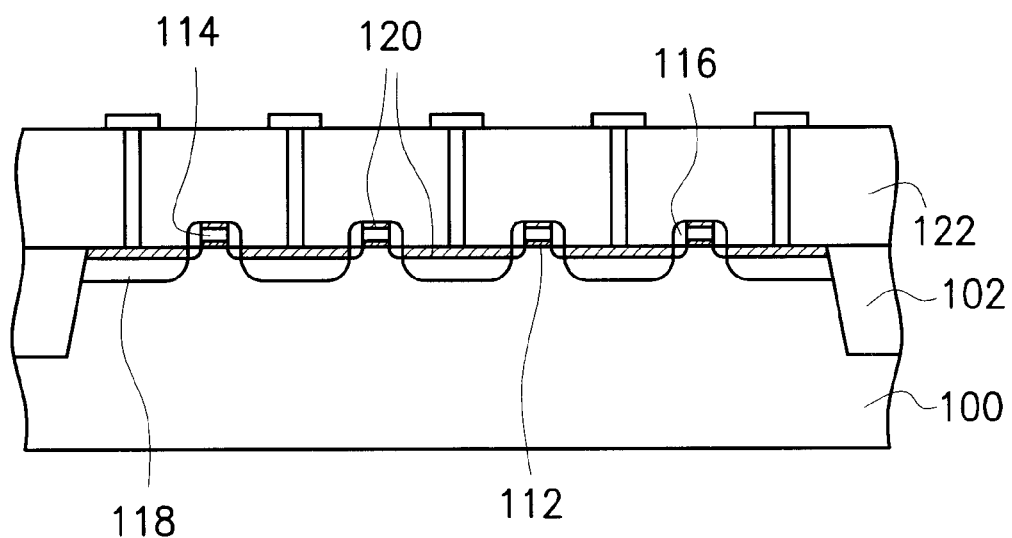

Reference will be made in detail to the present preferred embodiments of the invention, examples of which are illustrated in the accompanying drawings. Wherever possible, the same reference numbers are used in the drawings and the description to refer to the same or like parts.

Figure 2:
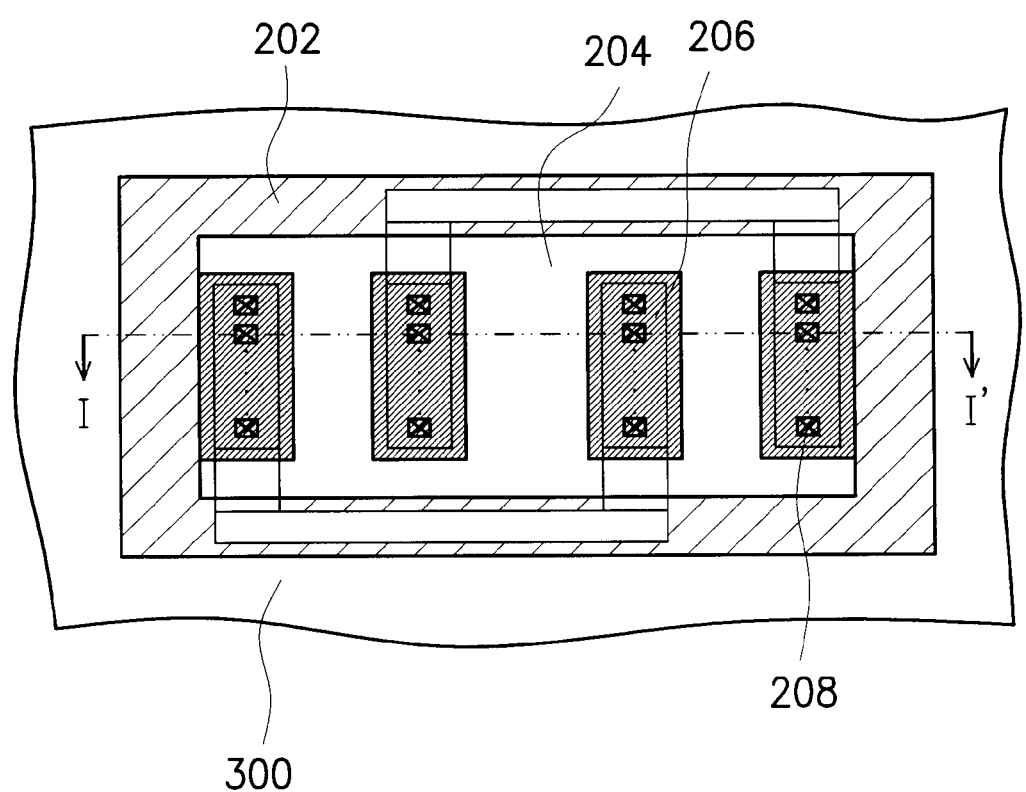
FIG. 2 is a schematic, top view showing the ESD protection device structure according to a preferred embodiment of the invention.

FIG. 2 is a schematic, top view showing the ESD protection device structure according to a preferred embodiment of the invention. Referring to FIG. 2, an ESD protection device structure is formed on a substrate 300, which may include a well, such as a P well or a N well. The active region 204 is also defined out in the substrate 200, surrounded by a shallow trench isolation structure 202. A P-well may be formed by implanting impurities such as boron and an N-well may be formed by implanting impurities such as phosphorous. For P well as an example, N-doped source/drain regions 206 are formed in the substrate and located within the active region 204, where the source/drain regions are situated in an alternating order, for example, source, drain, source, drain. A plurality of interconnect plugs 208 are formed located within each of the source/drain regions 206 with electrical contact. Each source region is electrically connected to another source region and likewise, each drain region is electrically connected to another drain region.

The embodiment of the present invention is described below with reference to FIG. 3A through 3E, which are schematic, cross sectional views, along the line I–I" in FIG. 2, showing the ESD protection device according to the preferred embodiment of the invention.

Figure 3A:
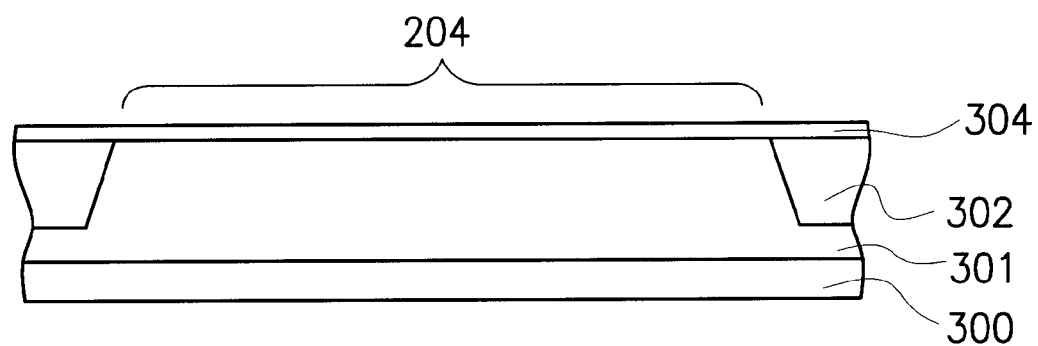
FIGS. 3A through 3E are schematic, cross sectional views, along the line I–I" in FIG. 2, showing the ESD protection device according to a preferred embodiment of the invention.

Referring to FIG. 3A, a silicon semiconductor substrate 300 is provided. A doped well 301 may also be formed in the substrate 300. A shallow trench isolation structure 302 (that is structure 202 in FIG. 2) is formed in the substrate 300 to define out an active region 204. An oxide layer 304 is optionally formed over the exposed substrate 300. The oxide layer 304 can be formed by thermal oxidation. The oxide layer 304 is used later to form a self-aligned silicide (salicide) layer.

Figure 3B:
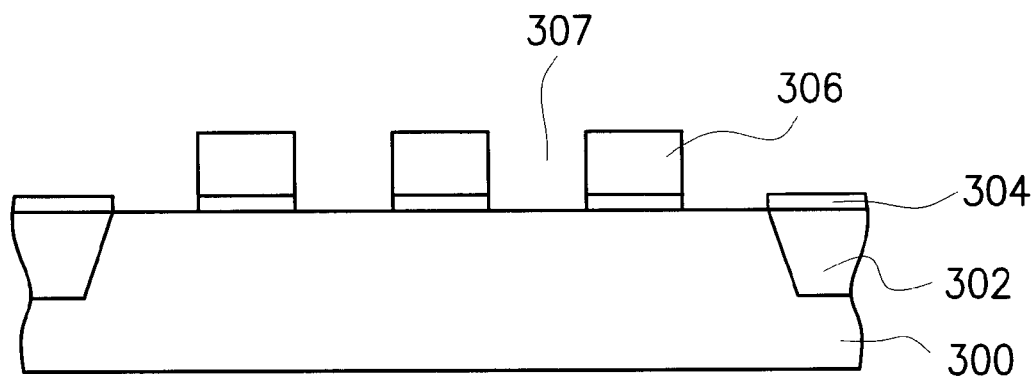

Referring to FIG. 3B, a photoresist layer 306 is formed on the surface of the oxide layer 304 and subsequently patterned to form several openings 307 that expose a portion of the oxide layer 304. Using the photoresist layer as an etching mask, the exposed portion of the oxide layer 304 is etched. As a result, a portion of the substrate 300 is exposed, at which several source/drain regions are to be formed later.

Figure 3C:
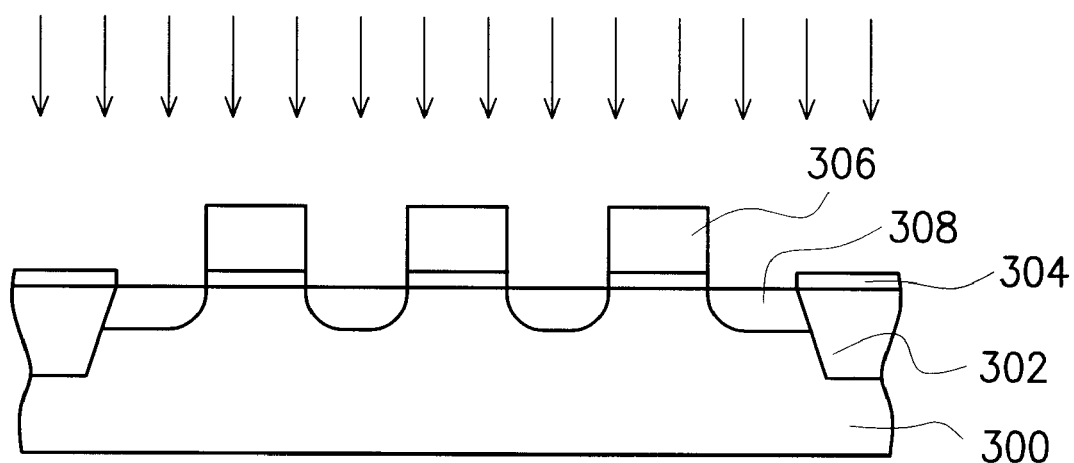

Referring to FIG. 3C, an ion implantation is next carried out with the photoresist layer 306 as a mask, implanting ions into the substrate 300 to form doped regions 308, which serves as, for example, source/drain regions 308. For an N-type doped regions 308, N-type dopants such as phosphorus or arsenic ions or both are implanted. In FIG. 3B, the oxide layer 304 can also be etched after the implantation process.

Figure 3D:
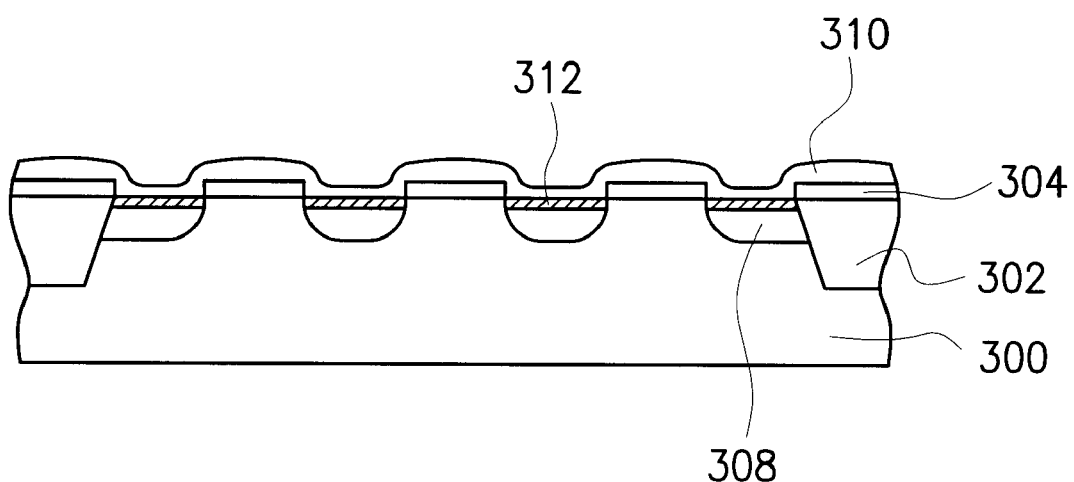

Referring to FIG. 3D, after ion implantation, the photoresist layer is removed, and a refractory or a noble metal layer 310 (e.g., Ti, W, Co, Ni, Pt, Cr, Pd or the combination thereof is blanket deposited over the substrate 300. The metal deposition can be performed by, for example, a chemical-vapor deposition (CVD) or a sputtering technique. A thermal process is performed to form salicide 312. This is due to a reaction between the refractory metal layer 310 and the silicon substrate 300. Afterwards, the portions of the unreacted metal layer are subsequently stripped away by, for example, dry etching, leaving behind salicide layers covering only the source/drain regions. The oxide layer 304 may also be removed. In this example, the oxide layer 304 still remains.

In another manner, after the formation of the source/drain regions, a patterned photoresist is formed to cover a portion of the source/drain regions, leaving a centrally exposed region. Next, a refractory or a noble metal layer (e.g., Ti, W. Co, Ni, Pt, Cr, Pd or the combination thereof) is blanket deposited on all areas. The metal deposition can be performed by, for example, a chemical-vapor deposition (CVD) or a sputtering technique. A thermal process is performed to form salicide. This is due to a reaction between the refractory metal layer and the silicon substrate. Afterwards, the portions of the unreacted metal layer and photoresist layer are subsequently stripped away by, for example, dry etching, leaving behind a portion of the salicide layer covering the source/drain region at about a central region. This centrally situated salicide layer improves the conductivity between the source/drain regions and the metal interconnects.

Figure 3E:
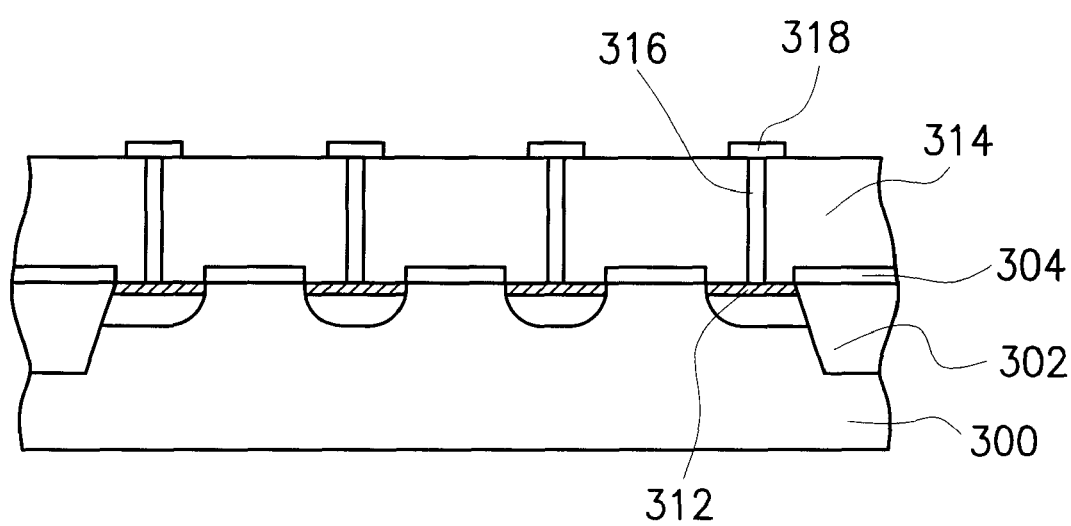

Referring to FIG. 3E, an inter-layer dielectric layer 314 is formed over the substrate 300. The inter-layer dielectric layer can be formed using, for example, silicon oxide. Subsequent steps for forming metal plugs 316 and metal interconnects 318 are carried out. Since these steps are unrelated to this invention, details are omitted here. As shown in FIG. 2, all the doped regions 308 serving as the source region are coupled together, and all the doped regions 308 serving as the source region are separately coupled together through the metal plugs 316, that is, plugs 208 in FIG. 2 and the interconnects 318.

The finger-type ESD structure of the invention includes only several doped regions, alternatively serving as the source regions and the drain regions without the LDD structure. The abrupt junction structure is included in the invention, therefore the Zener breakdown voltage is lower than the convention NMOS ESD circuit with LDD structure. This results in the higher bipolar turn-on speed and thereby achieve higher efficiency for ESD protection.

In the invention, since there id no gate structure is actually involved, the gate length, which is the distance between the source/drain regions, can be adjusted to be smaller than the usual gate length for the MOS transistor in the internal circuit, the bipolar turn-on ability is also effectively improved.

In the invention, it only needs to modify the pattern of the photomask to form the doped regions 308 and maybe the well. There is no additional photomask required in the invention. The invention does not causes much additional fabrication cost and complexity.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating an electrostatic discharge (ESD) protection device, the method comprising:
   providing a semiconductor substrate;
   forming an oxide layer over the semiconductor substrate;
   forming a photoresist layer over the oxide layer, where in the photoresist layer has a plurality of openings that expose a portion of the oxide layer;
   removing the exposed oxide layer;
   implanting ions into the semiconductor substrate, using the photoresist layer as an implantation mask, to form doped regions in the semiconductor substrate;
   forming a salicide layer on the doped regions; and
   forming an interconnecting structure to connect the doped regions to form an ESD circuit.

2. The method of claim 1, wherein the semiconductor substrate comprises a silicon wafer.

3. The method of claim 1, wherein the step of forming the salicide layer further comprises:
   forming a metal layer over the semiconductor substrate;
   performing a thermal process to trigger a reaction on an interface region between the metal layer and the semiconductor substrate at a portion comprising silicon material; and
   removing an unreacted portion of the metal layer.

4. The method of claim 3, wherein the unreacted portion of the metal layer is removed by dry etching.

5. The method of claim 3, wherein the step of forming the metal layer comprises one selected from the group consisting of a chemical-vapor deposition (CVD) and a sputtering deposition.

6. The method of claim 1, wherein the metal layer comprises one selected from the group consisting of titanium, tungsten, cobalt, nickel, platinum, chromium, palladium, and a combination thereof.

7. The method of claim 1, wherein the step of forming the photoresist layer comprises photolithography.

8. The method of claim 1, wherein the step of forming the oxide layer comprises a thermal oxidation process.

9. The method of claim 1, wherein the doped regions comprise of alternating source/drain regions.

10. A method for fabricating an electrostatic discharge (ESD) protection device, the method comprising:
    providing a substrate;
    forming a patterned photoresist layer, which has openings that expose the substrate;
    implanting ions into the substrate to form a plurality of doped regions within the openings;
    forming a dielectric layer to partially cover the doped regions and leave a central portion of the doped regions being exposed;
    forming a metal layer over the substrate with contact on the exposed portion of the doped regions;
    performing a thermal process to cause a reaction between the metal layer and silicon material at the exposed portion of the doped regions to form a salicide layer, wherein a portion of the metal layer remains unreacted;
    removing the unreacted portion of the metal layer; and
    forming an interconnecting structure to connect the doped regions to form an ESD circuit.

11. The method of claim 10, wherein the unreacted portion of the metal layer is removed by dry etching.

12. The method of claim 10, wherein the step of forming the metal layer comprises either a chemical-vapor deposition (CVD) or sputtering deposition.

13. The method of claim 10, wherein the metal layer comprises titanium, tungsten, cobalt, nickel, platinum, chromium, palladium, or a combination thereof.

14. The method of claim 10, wherein the step of forming the interconnecting structure comprises:
    forming a dielectric layer; and
    patterning the dielectric layer to form a plurality of contact plugs with electric connection on the doped regions.

15. The method of claim 10, wherein the doped regions comprise of alternating source/drain regions.

16. A structure of an electrostatic discharge (ESD) protection device, the structure comprising:
    a substrate;
    a well formed in the substrate;
    an active region formed in the well;
    a plurality of doped regions formed in the active region;
    a salicide layer formed on a surface of the doped regions;
    an inter-layer dielectric layer formed over the salicide layer and the substrate;
    a plurality of conductive plugs formed in the inter-layer dielectric layer with contact on the doped regions; and
    a plurality of metal interconnects formed on the inter-layer dielectric layer,
    whereby no gate structure is included within the structure of the ESD protection device.

17. The structure of claim 16, wherein the metal layer comprises one selectred from the group consisting of titanium tungsten, cobalt, nickel, platinum, chromium, palladium, and a combination thereof.

18. In a structure of an electrostatic discharge protection device including a substrate, a well, an active region, a plurality of gate structures, a plurality of source/drain regions, a plurality of lightly doped drain structures, a salicide layer, an inter-dielectric layer and a plurality of plugs, the improvement comprising:
    forming a plurality of doped regions to replace the gate structures and the source/drain regions, so that the gate structure and lightly doped drain structures are not used.

* * * * *